(12) United States Patent
Ito

(10) Patent No.: US 7,353,595 B2
(45) Date of Patent: Apr. 8, 2008

(54) METHOD FOR MANUFACTURING A PRINTED CIRCUIT BOARD THAT MOUNTS AN INTEGRATED CIRCUIT DEVICE THEREON

(75) Inventor: Koji Ito, Gifu (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 494 days.

(21) Appl. No.: 11/012,496

(22) Filed: Dec. 16, 2004

(65) Prior Publication Data

US 2005/0133256 A1  Jun. 23, 2005

(30) Foreign Application Priority Data

Dec. 19, 2003  (JP) .............................. 2003-423342

(51) Int. Cl.
*H01R 9/00* (2006.01)
*H05K 3/00* (2006.01)

(52) U.S. Cl. .............................. 29/842; 29/832; 29/846; 29/854; 29/874; 174/250; 174/261; 205/125; 257/686; 257/E23.065; 257/E23.079

(58) Field of Classification Search ................ 29/842, 29/832, 846, 854, 874; 174/250, 261; 205/125; 257/E23.065, E23.079, 686
See application file for complete search history.

(56) References Cited

U.S. PATENT DOCUMENTS

| 6,418,615 | B1 * | 7/2002 | Rokugawa et al. ............ 29/852 |
| 6,591,495 | B2 * | 7/2003 | Hirose et al. .................. 29/846 |

FOREIGN PATENT DOCUMENTS

| JP | A 01-143386 | 6/1989 |
| JP | A-02-079442 | 3/1990 |
| JP | A-05-144883 | 6/1993 |
| JP | A-05-251501 | 9/1993 |
| JP | A 06-264283 | 9/1994 |
| JP | A-10-163275 | 6/1998 |
| JP | A 11-188857 | 7/1999 |
| JP | A-11-317428 | 11/1999 |
| JP | A-2000-243788 | 9/2000 |
| JP | A-2002-198401 | 7/2002 |
| JP | A-2003-309148 | 10/2003 |

\* cited by examiner

*Primary Examiner*—Tim Phan
(74) *Attorney, Agent, or Firm*—Oliff & Berridge, PLC

(57) ABSTRACT

A tape substrate includes IC lands electrically connected to pins of a driver IC (integrated circuit), circuit board terminal lands electrically connected to an external circuit board, test lands for testing the driver IC mounted on the tape substrate, and a plating terminal used for plating the land. The test lands are arranged in a matrix. The plating terminal is disposed so as to surround the IC lands, the circuit board terminal lands, and the test lands.

11 Claims, 15 Drawing Sheets

METHOD FOR MANUFACTURING A PRINTED CIRCUIT BOARD THAT MOUNTS AN INTEGRATED CIRCUIT DEVICE THEREON

This application claims priority from JP 2003-423342, filed Dec. 19, 2003, the entire disclosure of which is incorporated herein by reference thereto.

BACKGROUND OF THE INVENTION

1. Field of Invention

This application relates to a method for manufacturing a printed circuit board that mounts an integrated circuit device thereon, and to the printed circuit board.

2. Description of Related Art

Semiconductor devices are becoming smaller in size, due to demands to downsize electronic apparatuses. Accordingly, pins for inputting or outputting an electric signal to or from the semiconductor devices are getting miniaturized and provided at a narrow pitch. As a semiconductor device is further miniaturized with its pins provided at a narrower pitch, a probe of a tester will accidentally contact pins other than a particular pin of the semiconductor device mounted on a printed circuit board when the device is tested. Therefore, test lands that are respectively electrically connected to pins of a semiconductor device mounted on a printed circuit board are provided at an outer or edge portion of the printed circuit board, as disclosed in FIG. 1 of Japanese Laid-Open Patent Publication No. 11-188857. When the semiconductor device is tested, a probe of a tester is applied to the test land. Because the probe is applied to the test land, which is provided at a portion where enough space is allowed for the test land, contact of the probe to other pins can be prevented.

SUMMARY

Lands for being connected or bonded to each of the pins of the semiconductor on a printed circuit board are normally plated. In view of reducing manufacturing costs, electrolytic plating is generally applied to the lands due to its high-speed plating. When electrolytic plating is performed for the lands on the printed circuit board, a predetermined voltage has to be applied individually to all the lands that are to be connected or bonded to the pins of the semiconductor. To apply the voltage, a plurality of terminals has to be precisely made to contact with each of the lands, which leads to a complicated plating mechanism. Further, it takes longer time to position the terminals relative to each land, which leads to a decrease in the efficiency of manufacture or production of the printed circuit board that mounts the device thereon. Efficiency is strongly desired in the device-mounting circuit board manufacture and that includes in the processes of testing the semiconductor device using the test land and plating the device lands. Disclosed herein is an improved method for manufacturing a printed circuit board that mounts an integrated circuit device thereon, and the printed circuit board.

According to one aspect, a method for manufacturing a printed circuit board that mounts an integrated circuit device thereon may include a pattern forming step of forming, on the printed circuit board, a plurality of device lands for being electrically connected to pins of the integrated circuit device, a plurality of terminal lands for being electrically connected to terminals of an external device, a plurality of test lands used for performing an operational test of the integrated circuit device when the integrated circuit device is mounted on the printed circuit board, a plating terminal used for plating the terminal lands, and a wiring pattern, including a plurality of traces, that electrically connect the device lands to the terminal lands, the test lands and the plating terminal, such that all the test lands are disposed outside an area interposed between the plurality of terminal lands and the plurality of device lands; a terminal land plating step of applying electrolytic plating to the terminal lands using the plating terminal; a mounting step of mounting the integrated circuit device on the printed circuit board so as to electrically connect the device lands and the pins; a plating terminal insulating step of electrically disconnecting the terminal lands and the plating terminal after the terminal land plating step; a testing step of performing the operational test of the integrated circuit device mounted in the mounting step; and a separating step of separating a portion of the printed circuit board where the plurality of device lands and the plurality of terminal lands are disposed from a portion of the printed circuit board where the plurality of test lands are disposed.

According to another aspect, a printed circuit board may include a plurality of device lands that are capable of being electrically connected to pins of an integrated circuit device when the integrated circuit device is mounted on the printed circuit board; a plurality of terminal lands that are capable of being electrically connected to terminals of an external device when the integrated circuit device is mounted on the printed circuit board; a plurality of test lands used for performing an operational test of the integrated circuit device when the integrated circuit device is mounted on the printed circuit board; a plating terminal used for plating the terminal lands; and a wiring pattern including a plurality of traces that electrically connect the device lands to the terminal lands, the test lands and the plating terminal. All the test lands may be disposed outside an area interposed between the plurality of terminal lands and the plurality of device lands.

An electrode of a plating machine for applying the voltage may be readily connected to the plating terminal, so that a voltage application mechanism for plating may be simplified. In addition, the time for positioning of the electrode may be reduced. The test lands may be disposed outside an area interposed between the terminal lands and the device lands, so that the test land area may be readily separated in the separating step. Thus, the manufacturing of the printed circuit board that mounts the integrated circuit device thereon may be effectively performed. In the pattern forming step and in the printed circuit board, the plating terminal may be formed at both end portions of an area including the plurality of device lands, the plurality of terminal lands, and the plurality of test lands.

Thus, the plating terminal may be readily cut off in the plating terminal insulating step. Thus, efficient electrical disconnection or insulation between the plating terminal and the terminal lands may be achieved, and the printed circuit board that mounts the driver IC 80 thereon may be effectively manufactured.

In the pattern forming step and in the printed circuit board, the plating terminal may be formed to surround the plurality of device lands, the plurality of terminal lands and the plurality of test lands. An electrode of a plating machine for applying voltage may be readily connected to the plating terminal, so that a voltage application mechanism for plating may be simplified. In addition, time for positioning the electrode may be reduced.

In the pattern forming step, the plurality of test lands may be arranged in a matrix and the wiring pattern may be formed such that each of the traces thereof may pass between the adjacent test lands. Thus, even when a number of test lands are provided on the printed circuit board, sufficient areas of the test lands may be ensured while preventing distance between the adjacent traces of the wiring pattern from being increased.

A tape masking step of attaching masking tape to an area including the plurality of the test lands to prevent electrolytic plating from being applied to the test lands, may be provided before the terminal land plating step.

Thus, the electrolytic plating, which thickens or widens plating application areas due to the deposition of a metal layer, may not be applied to the test land area. Therefore, even when the test lands and the traces of the wiring pattern connected to the test lands are disposed close to each other, due to the arrangement of the test lands in a matrix, occurrence of short circuits in the test lands and/or the wiring pattern may be prevented.

In the tape masking step, the masking tape may be attached to an area including the plurality of the device lands. Thus, the electrolytic plating, which thickens or widens plating application areas due to the deposition of metal layer, may not be applied to the device land area.

The method may further include a resist film forming step of forming solder resist film around the area including the plurality of device lands and the area including the plurality of test lands. The masking tape may be attached on the solder resist film in the tape masking step.

Formation of the solder resist film may make the surface of the printed circuit board, having protruded portions due to the wiring pattern formation, flatter, so that the masking tape may make intimate contact with the solder resist film. Thus, masking may be reliably performed.

The method may further include a mask removing step of removing the masking tape from the area including the plurality of device lands and the area including the plurality of test lands; and a displacement plating step of applying displacement plating to the plurality of device lands.

Thus, the device lands may not be thickened or widened after the displacement plating is applied to the device lands. Accordingly, short circuits in the device lands may be prevented.

The terminal land plating step may include a nickel plating step of plating the terminal lands with nickel and a solder plating step of plating the terminal lands with solder after the nickel plating step. In the displacement plating step, surfaces of the device lands may be replaced with tin.

In the pattern forming step, a metal layer of copper may be formed on a polyimide film substrate and the metal layer may be etched to form the plurality of the device lands, the plurality of terminal lands, the plurality of test lands, the plating terminal and the wiring pattern.

In the printed circuit board, the plurality of test lands, the plurality of terminal lands and the plurality of device lands may be disposed in parallel along a same direction, with a row of the plurality of terminal lands disposed in a center between a row of the plurality of test lands and a row of the plurality of device lands. The wiring pattern may directly connect the test lands and the terminal lands, and may directly connect the terminal lands and the device lands. Thus, the wiring pattern arrangements may be simplified and the plurality of the test lands may be readily separated or cut off at one time.

In the printed circuit board, the plurality of the terminal lands may be plated with nickel and solder, and the plurality of the device lands and the test lands may be plated with tin by displacement plating.

In the printed circuit board that mounts the integrated circuit device thereon, the pins of the integrated circuit device may be electrically connected to the plurality of device lands.

BRIEF DESCRIPTION OF THE DRAWINGS

An exemplary embodiment will be described in detail with reference to the following figures wherein.

DETAILED DESCRIPTION OF EMBODIMENTS

Figure 1:
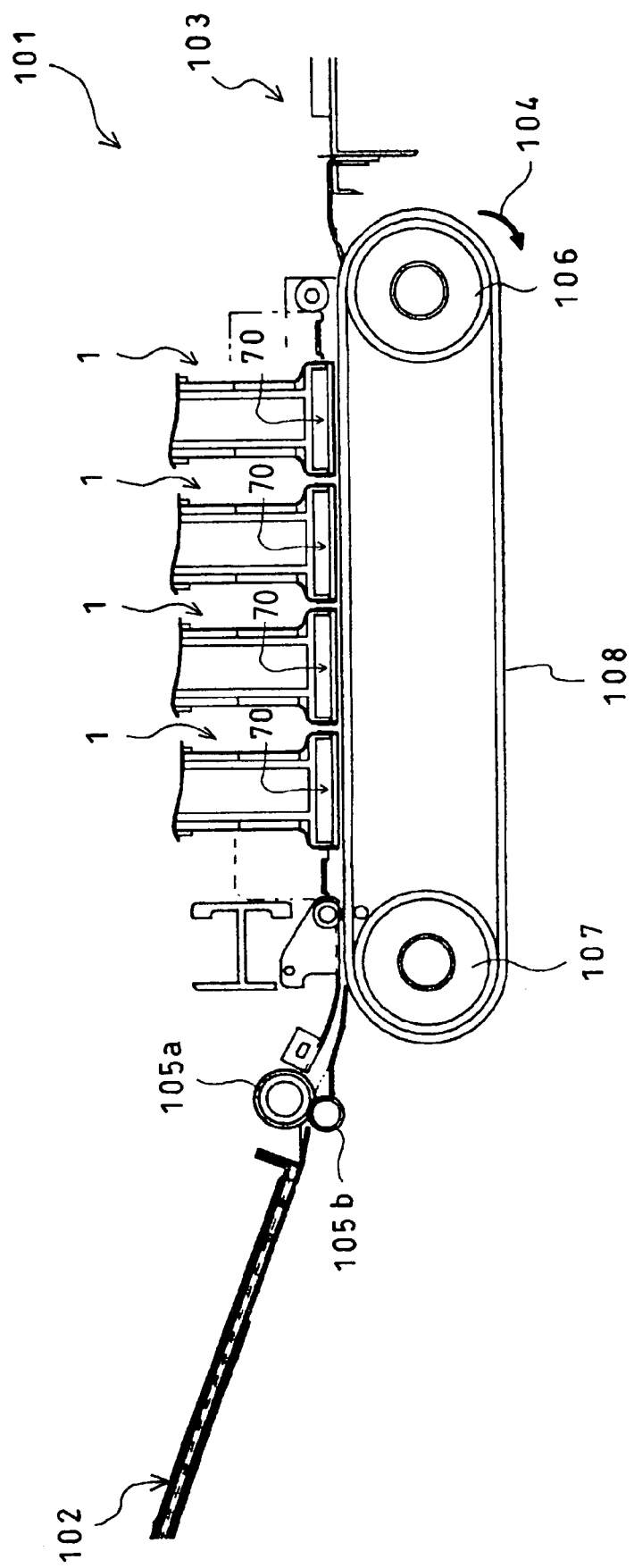
FIG. 1 is a side view showing a general structure of an inkjet printer including a printed circuit board that mounts an integrated circuit device thereon according to an exemplary embodiment.

A general structure of an inkjet printer 101, including a printed circuit board, according to an exemplary embodiment will be described with reference to FIG. 1. The inkjet printer 101 is a color inkjet printer having four inkjet print heads 1. The printer 101 is provided with a sheet supply unit 102 on the left of FIG. 1 and a sheet discharge unit 103 on the right.

Inside the printer 101, a sheet feeding path is formed from the sheet supply unit 102 toward the sheet discharge unit 103. Disposed downstream of the sheet supply unit 102 are a pair of feed rollers 105a, 105b that feed a sheet of a recording medium, while holding the sheet between the feed rollers 105a, 105b. The sheet is conveyed by the pair of feed rollers 105a, 105b in a sheet feeding direction from left to right in FIG. 1. Disposed in the middle of the sheet feeding path are two belt rollers 106, 107, a conveyor belt 108, which is endless and looped around the two belt rollers 106, 107, and a conveyor motor (not shown) that drives the belt rollers 106, 107. An outer surface or a conveying surface of the conveyor belt 108 is treated with silicone. While the sheet fed by the feed rollers 105a, 105b is held on the conveying surface of the conveyor belt 108 by its adhesive force, the sheet is conveyed downstream (rightward in FIG. 1) with the belt roller 106 rotated in a clockwise direction as indicated by an arrow 104.

The four print heads 1 are arranged as line printers. Each of the four print heads 1 has a head body 70 on a lower end thereof. The four print heads 1 are aligned adjacent to each other, such that longitudinal direction thereof is perpendicular to the sheet feeding direction and parallel to a main scanning direction. Each head body 70 has a plurality of ejection nozzles having very minute diameters, formed on a bottom surface thereof facing the sheet feeding path. Thus, an ejection surface with the ejection nozzles is formed on the bottom surface. Each head body 70 of the print head 1 ejects one of magenta, yellow, cyan, and black ink. Each color ink is ejected from the ejection nozzles onto an upper surface (print surface) of the sheet, to form a desired color image on the sheet.

Figure 2:
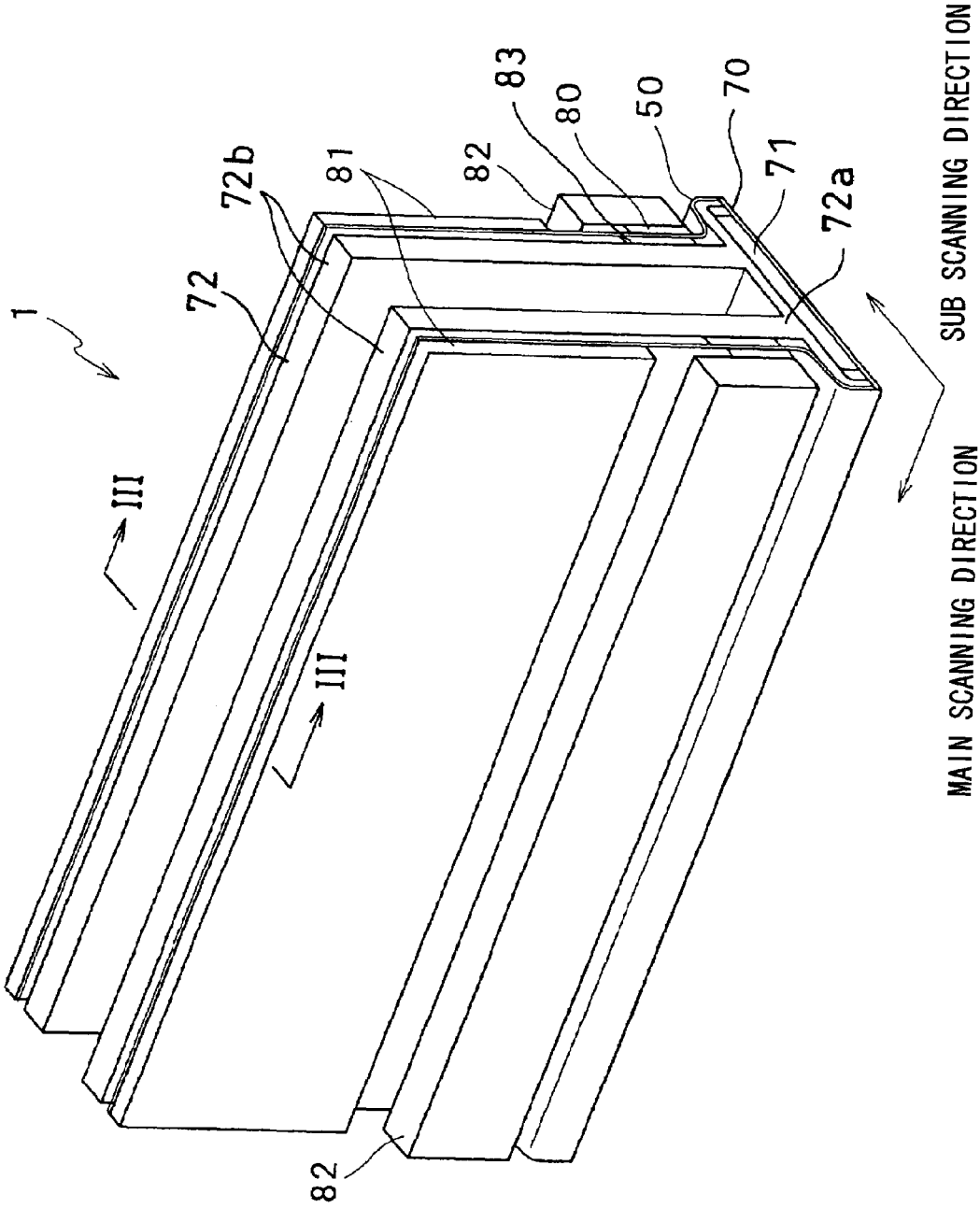
FIG. 2 is a perspective view of a print head of the inkjet printer.
Figure 3:
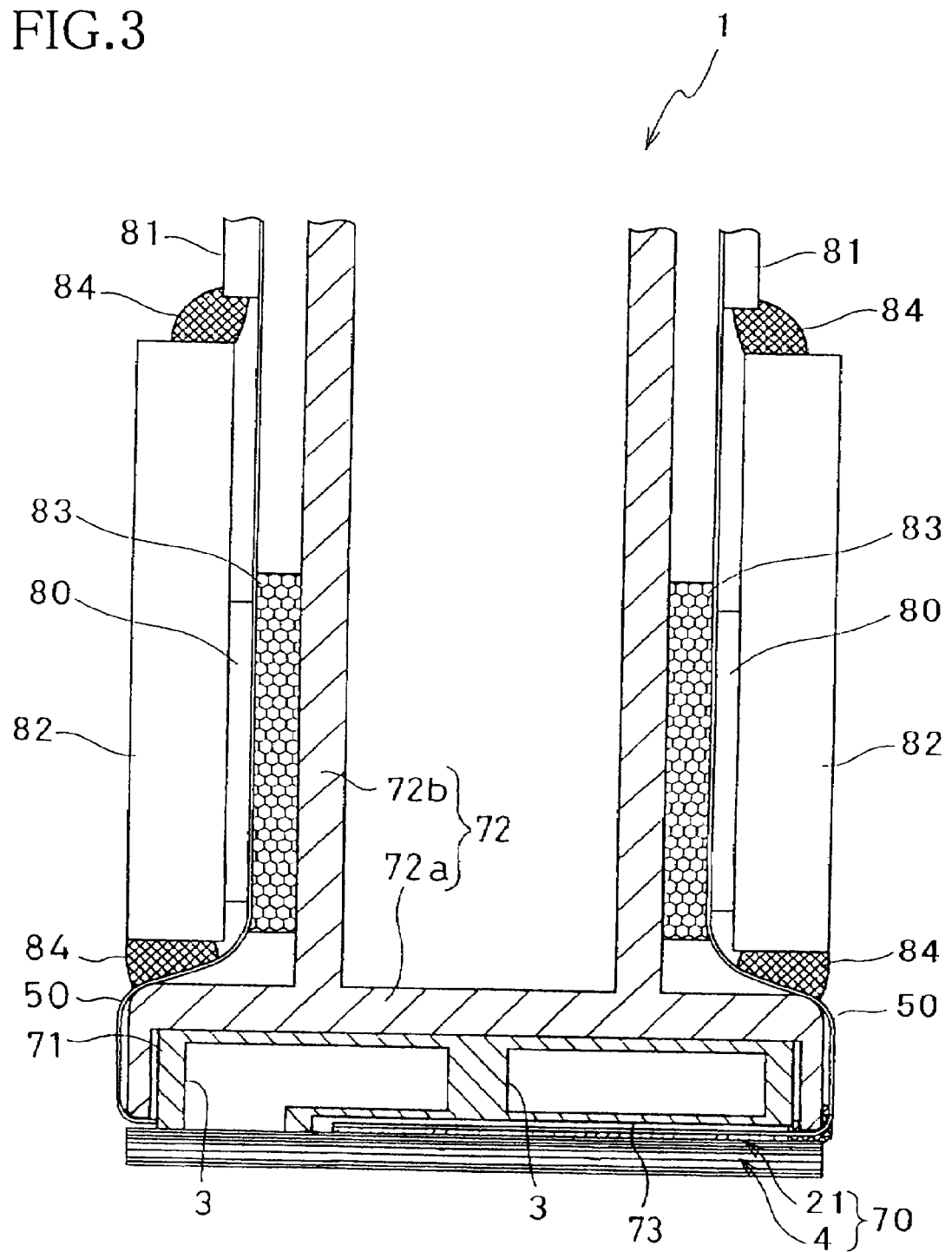
FIG. 3 is a sectional view of the print head, taken along line III-III in FIG. 2.

With reference to FIGS. 2 and 3, the print head 1 will be described below. The print head 1 includes the head body 70 for ejecting ink onto a sheet, the head body 70 having a substantially rectangular shape when viewed in a plan view and extending in the main scanning direction, and a base block 71 formed with two ink reservoirs 3 that are disposed above the head body 70 and serve as ink passages to the head body 70.

The head body 70 includes a passage unit 4 formed with a plurality of individual ink passages to the nozzles and actuator units 21 whose surfaces are affixed to an upper face of the passage unit 4. The ink reservoirs 3 in the base block 71 communicate with the passage unit 4 through openings formed on a lower surface 73. Ink is supplied to the individual ink passages formed in the passage unit 4 from the ink reservoirs 3. The individual ink passages include pressure chambers that generate pressure to eject ink from the nozzles.

The actuator unit 21 is a unit that generates pressure in each of the pressure chambers in the individual ink passages. The actuator unit 21 has a piezoelectric sheet sandwiched between a common electrode kept at a ground potential and a plurality of individual electrodes provided in association with the pressure chambers. The piezoelectric sheet is made of a lead zirconate titanate (PZT)-base ceramic material having ferroelectricity. Upon the application of voltages to the individual electrodes, areas of the piezoelectric sheet corresponding to the individual electrodes act as active layers or active portions, so as to apply pressure to walls of the pressure chambers corresponding to the individual electrodes. Thus, pressure is generated in the pressure chambers. By the generated pressure, ink in the pressure chambers is ejected from the nozzles.

The base block 71 is fixedly bonded to a recess formed on a lower surface of a holding portion 72a of a holder 72. The holder 72 includes the holding portion 72a, and a pair of flat plate-like projections 72b that extend perpendicularly to an upper face of the holding portion 72a with a predetermined distance therebetween. A FPC (flexible printed circuit) 50 that is a thin flexible printed circuit board and functions as a power feeding member, is connected or bonded to the individual electrodes of each actuator unit 21 and disposed along each projection 72b. The FPC 50 includes a base film made of polyimide film with a thickness of about 50 µm. The FPC 50 attached to each actuator unit 21 is disposed along an outer side face of either one of the projections 72b with an elastic member 83, such as a sponge, interposed between the FPC 50 and the projection 72b. A driver IC 80 that drives the actuator unit 21 is mounted on the FPC 50, which is disposed along the surfaces of the projection 72b of the holder 72. A heat sink 82 of substantially rectangular parallelepiped shape is disposed in close contact with an outer face of the driver IC 80. A board 81 that is connected to the FPC 50 is disposed above the drive IC 80 and the heat sink 82. Seal members 84 are provided between the heat sink 82 and the board 81, as well as between the heat sink 82 and the FPC 50.

The board 81 is a control board that controls the actuator 21, based on an instruction from a control device (not shown), to form a desired image onto a sheet. Conductive patterns formed on the board 81 are electrically connected to the driver IC 80, via the FPC 50. A control signal for controlling the actuator unit 21 is output from the board 81 to the driver IC 80, in order to control the actuator unit 21. The driver IC 80 is a bare chip (integrated circuit device) for driving the actuator unit 21 of the print head 1, based on the control signal from the board 81. The driver IC 80 is electrically connected to the actuator unit 21, via the FPC 50. The driver IC 80 converts the control signal from the board 81 into a drive signal, and outputs the drive signal to the actuator unit 21.

Figure 4:
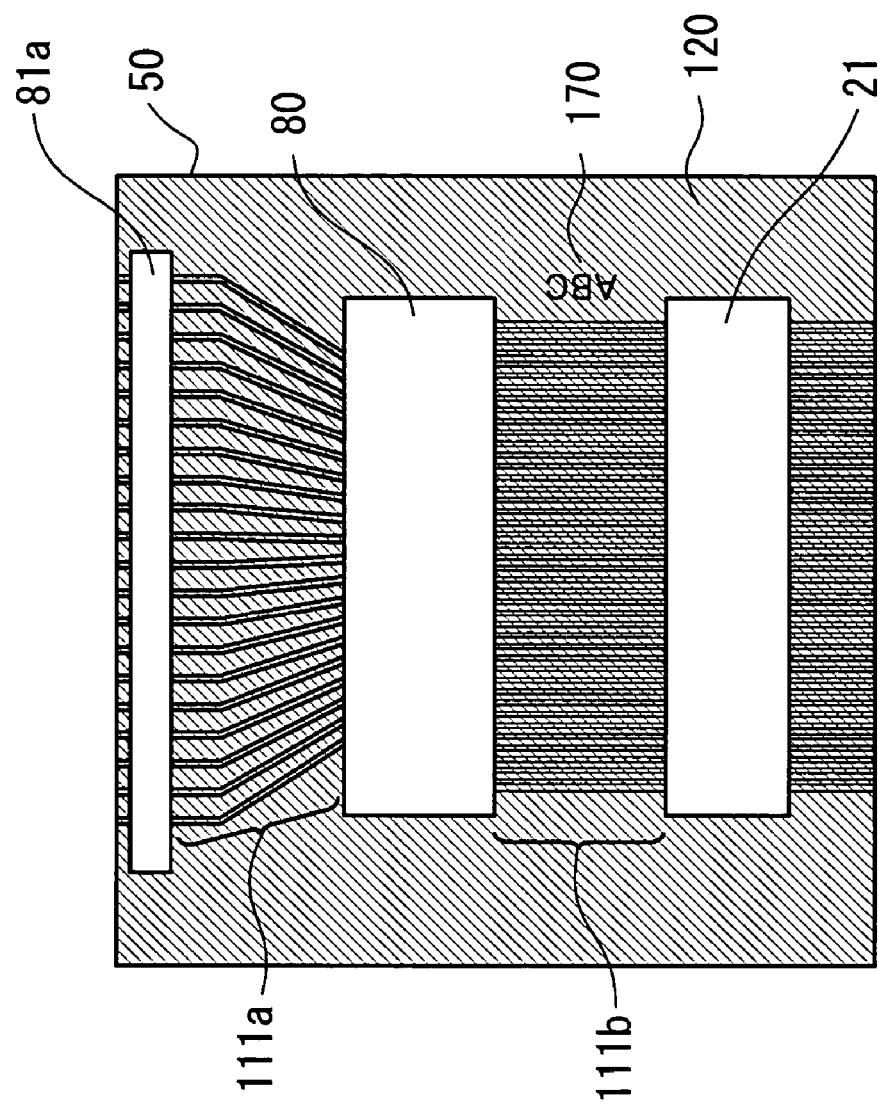
FIG. 4 is a plan view of the printed circuit board of the inkjet printer.

With reference to FIG. 4, the driver IC 80 and the FPC 50 are described in detail below. A hatched area 120 in FIG. 4 indicates an area where solder resist film with a thickness of about 10 µm is formed. As shown in FIG. 4, a board terminal section 81a of the board 81, the driver IC 80, and the actuator unit 21, which are disposed in this order along one direction, are connected or bonded to the FPC 50. Terminals of the board terminal section 81a are electrically connected to gold bumps, as projected electrodes, disposed on a surface of the driver IC 80 facing the FPC 50, through a wiring pattern 111a with a thickness of about 15 µm formed on the FPC 50. The bumps of the driver IC 80 and the individual electrodes of the actuator unit 21 are electrically connected through a wiring pattern 111b. The identifier "ABC" 170 for identifying the FPC 50 is provided beside the wiring pattern 111b. Each of the wiring patterns 111a, 111b is formed by a plurality of traces.

The control signal of about 3.3 V, for controlling the actuator unit 21 is serially output from the board 81 to the driver IC 80, through the board terminal section 81a and the wiring pattern 111a. The control signal serially input from the board 81 to the driver IC 80 is converted by the driver IC 80 to the drive signal of about 30 V. The drive signal is parallel output to each individual electrode of the actuator unit 21, through the wiring pattern 111b. With such a signal output structure, the number of traces forming the wiring pattern 111a is set to be smaller than the number of traces forming the wiring pattern 111b.

Figure 5:
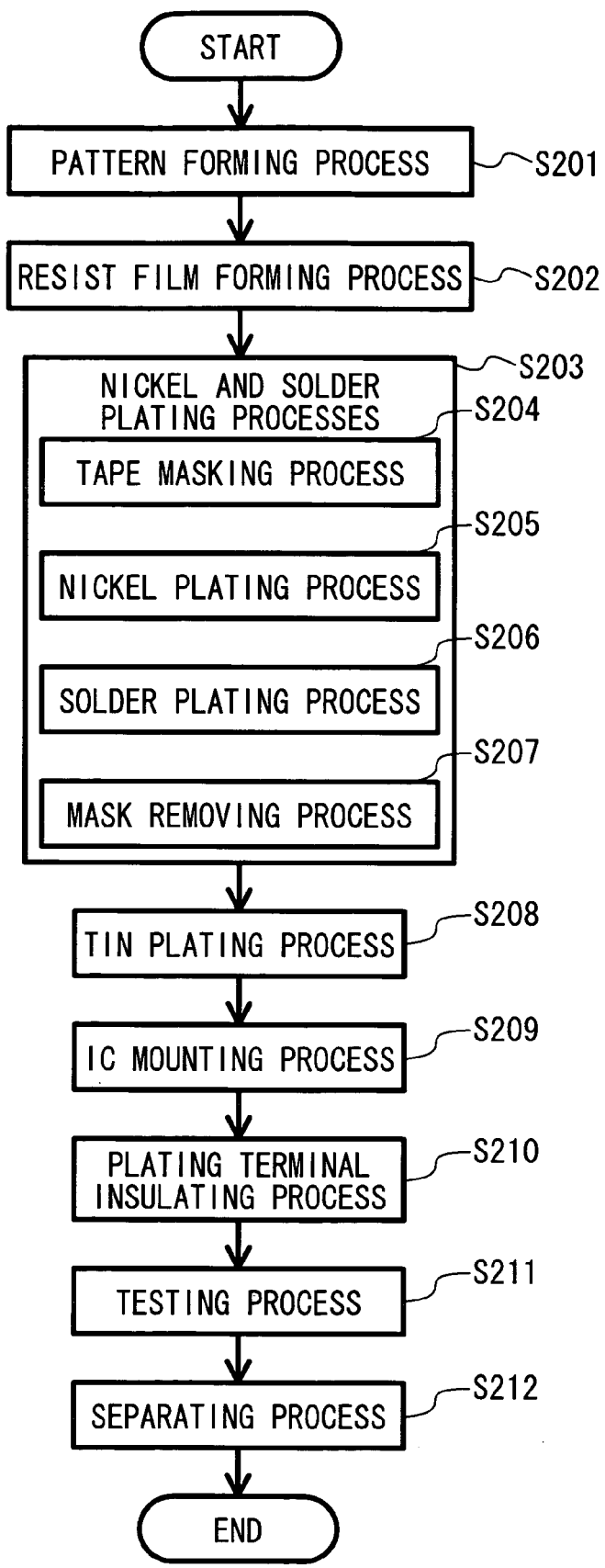
FIG. 5 is a block diagram showing manufacturing processes of the printed circuit board that mounts the integrated circuit device thereon.

A method for manufacturing the FPC 50 that mounts the driver IC 80 thereon will be described with reference to FIGS. 5 through 15. The FPC 50 is a flexible printed circuit board with patterns formed on a long tape substrate 110 and the driver IC 80 mounted thereon using the TAB (tape automated bonding) or COF (chip on film) technology. As shown in FIG. 5, a method for manufacturing the FPC 50 that mounts the driver IC 80 thereon includes a pattern forming process S201, a resist film forming process S202, nickel and solder plating processes S203, a tin plating process S208, an IC mounting process S209, a plating terminal insulating process S210, a testing process S211, and a separating process S212, which are sequentially performed. Each process will be described in detail below.

Figure 6:
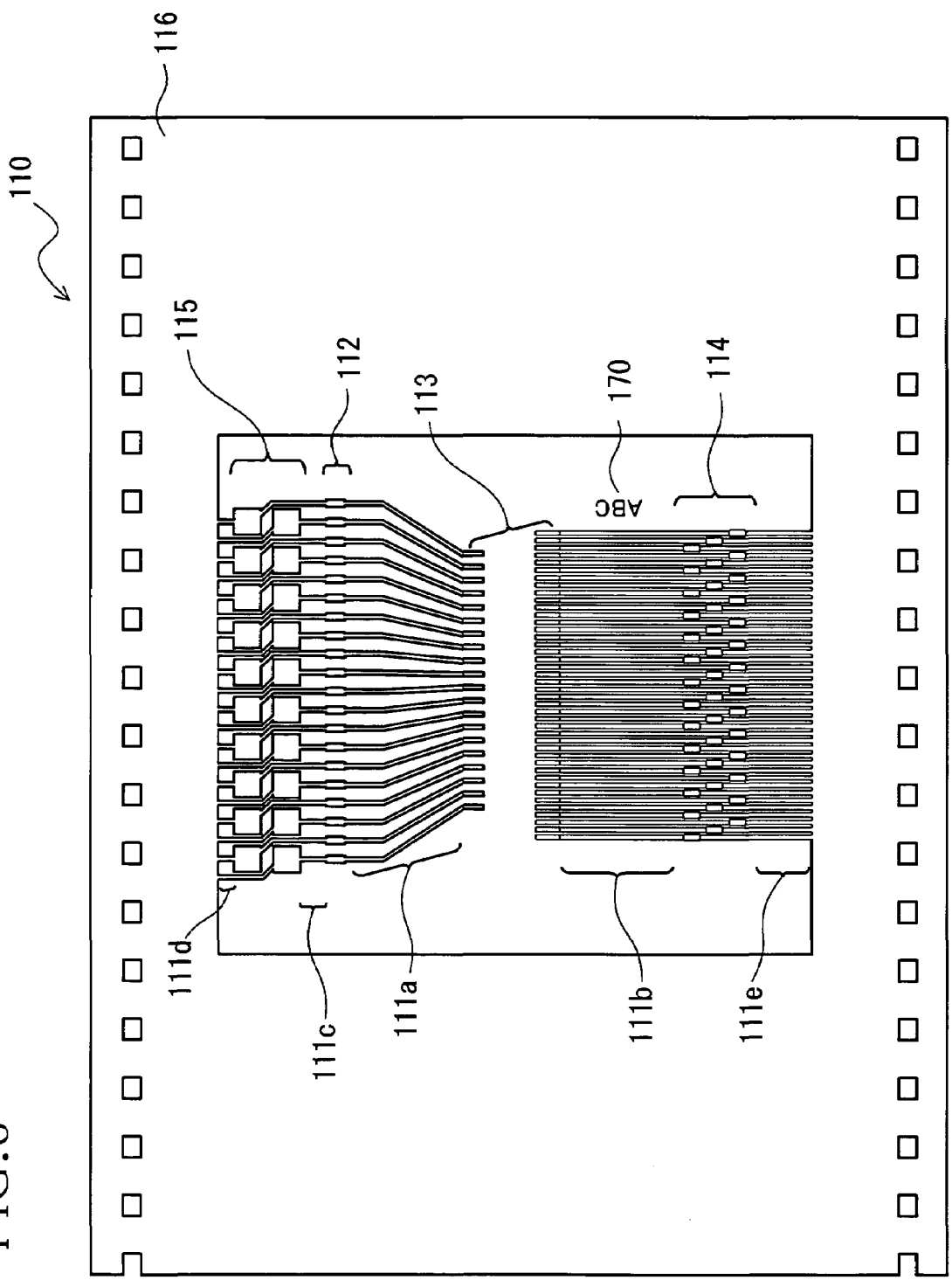
FIG. 6 is a plan view of a long tape substrate with metal patterns formed in a pattern forming process in FIG. 5.

In the pattern forming process S201, copper is applied to the long tape substrate 110, as shown in FIG. 6, to form a metal layer on the substrate 110. The metal layer is etched to form metal patterns. To form the metal layer of copper on the tape substrate 110, the copper film may be affixed to the tape substrate 110, the copper layer may be deposited on the tape substrate 110 by sputtering, or a thin copper layer may be first deposited on the tape substrate 110 by sputtering and then plated with copper. FIG. 6 shows the tape substrate 110 with the metal patterns formed thereon in the pattern forming process S201. Substantially rectangular holes, which are provided along the longitudinal direction of the tape substrate 110 at each side of the substrate 110 with respect to its width direction, are used to feed the tape substrate 110 in a production line. As shown in FIG. 6, formed on the tape substrate 110, as metal patterns, are lands 112 for the terminals of the board terminal section 81a (board terminal lands 112), lands 113 for the driver IC 80 (IC lands 113), lands 114 for the actuator unit 21 (actuator lands 114), test lands 115, a plating terminal 116, and wiring patterns 111a-111e.

The board terminal lands 112, for being connected or bonded to the terminals of the board terminal section 81a, are aligned in a row along the longitudinal direction of the tape substrate 110. The IC lands 113, for being connected or bonded to the bumps of the driver IC 80, are aligned in two rows along the longitudinal direction of the tape substrate 110, parallel to the board terminal lands 112. The IC lands 113 disposed on the side of the actuator lands 114 are aligned in a finer or narrower pitch than the IC lands 113 disposed on the side of the board terminal lands 112. The actuator lands 114, for being connected or bonded to the individual electrodes of the actuator unit 21, are disposed in three rows along the longitudinal direction of the tape substrate 110, so as not to align with a next land 114 with respect to the width direction of the tape substrate 110. Probes 162 of a tester 160 (which will be described below with reference to FIG. 14) for testing the driver IC 80 make contact with the test lands 115. The test lands 115 are arranged in a matrix in two rows along the longitudinal direction of the tape substrate 110. In other words, the test lands 115 are disposed so as to overlap each other in the longitudinal direction and width direction of the tape substrate 110. The plating terminal 116 is one terminal in contact with an electrode of a plating machine. The plating terminal 116 is disposed to surround all of the other lands 112-115. As shown in FIG. 6, the test lands 115, the board terminal lands 112, the IC lands 113, and the actuator lands 114 are arranged in order along the width direction of the tape substrate 110.

The wiring pattern 111a electrically connects the board terminal lands 112 and the IC lands 113 disposed on the side of the board terminal lands 112 directly. The wiring pattern 111b electrically connects the IC lands 113 disposed on the side of the actuator lands 114, and the actuator lands 114 directly. The wiring pattern 111c electrically connects the board terminal lands 112 and the test lands 115 directly. The wiring pattern 111d electrically connects the plating terminal 116 and the test lands 115 directly. With the arrangement of the test lands 115 in a matrix, the distance between the traces of the wiring pattern 111c, as well as between the traces of the wiring pattern 111d, which are connected to the test lands 115, becomes relatively shorter. All the lands 112-115 and the plating terminal 116 are electrically connected by the wiring patterns 111a-111e. The identifier "ABC" 170 for identifying the FPC 50 is provided by etching beside the wiring pattern 111b in the pattern forming process S201 at the same time the metal patterns are formed.

Figure 7:
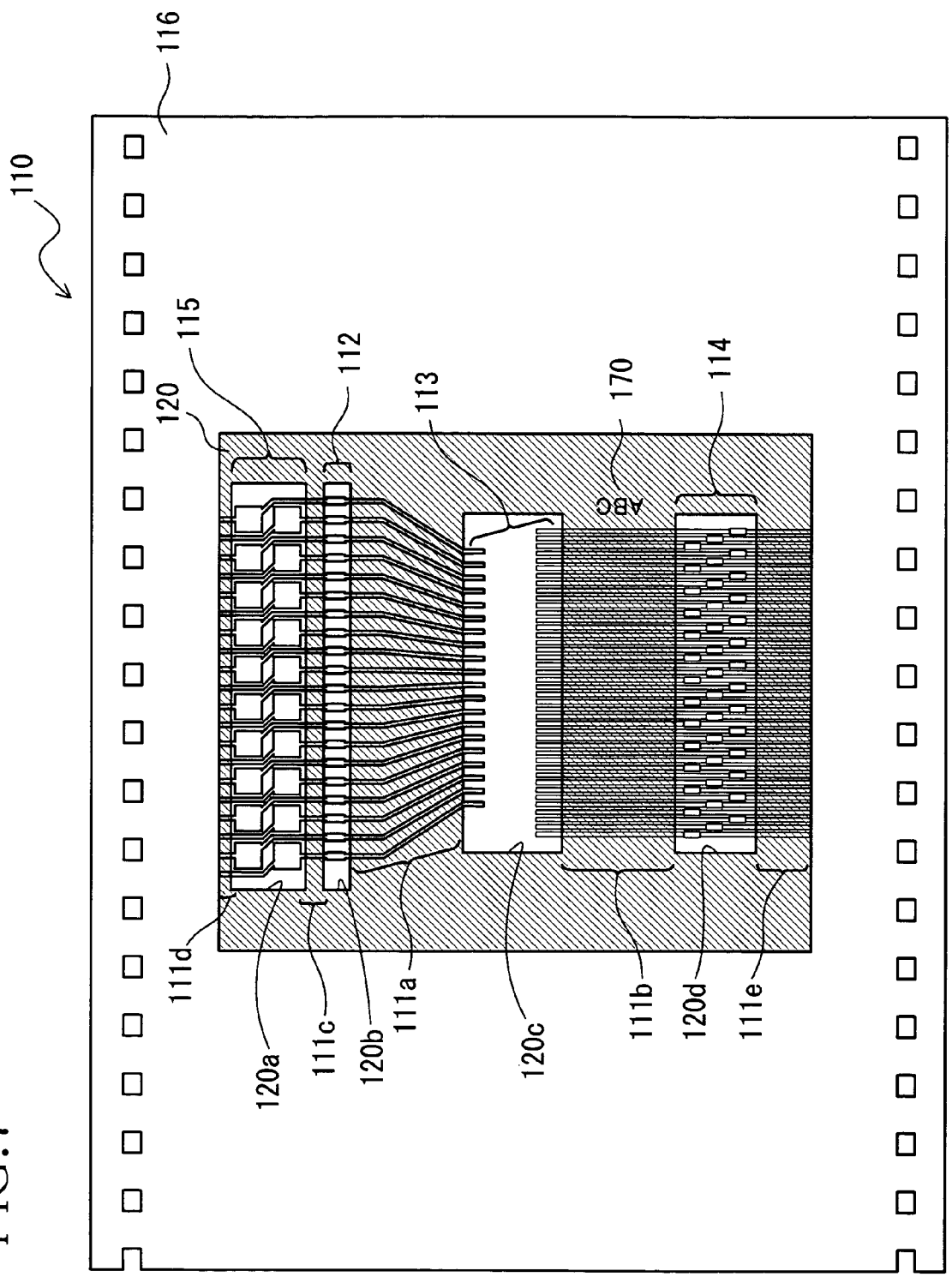
FIG. 7 is a plan view of the tape substrate with resist film formed in a resist film forming process in FIG. 5.

In the resist film forming process S202, an insulation film of a solder resist film is formed on the tape substrate 110 with the metal patterns formed in the pattern forming process S201. FIG. 7 shows the tape substrate 110 with the solder resist film formed thereon in the resist film forming process S202. As shown in FIG. 7, the solder resist film 120 is applied to the tape substrate 110 at the hatched area in FIG. 7, except for a resist non-application area 120a provided at a portion where the test lands 115 are disposed, a resist non-application area 120b provided at a portion where the board terminal lands 112 are disposed, a resist non-application area 120c provided at a portion where the IC lands 113 are disposed, and a resist non-application area 120d provided at a portion where the actuator lands 114 are disposed.

In the nickel and solder plating processes S203, the board terminal lands 112 and the actuator lands 114 are plated with nickel and solder. The nickel and solder plating processes S203 includes a tape masking process S204, a nickel plating process S205, a solder plating process S206, and a mask removing process S207 that are sequentially performed in order.

Figure 8:
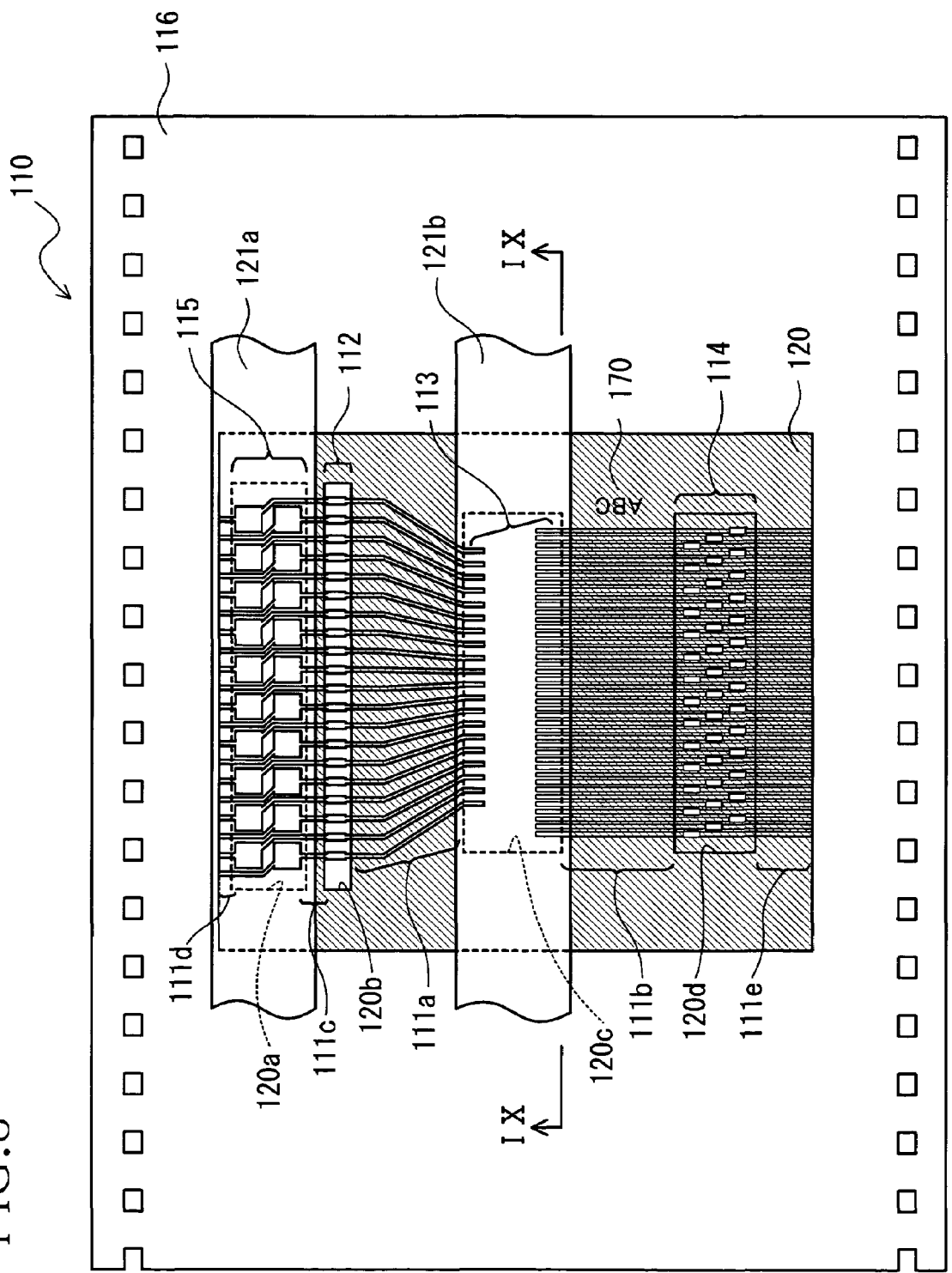
FIG. 8 is a plan view of the tape substrate with making tape applied thereto in a tape masking process in FIG. 5.
Figure 9:
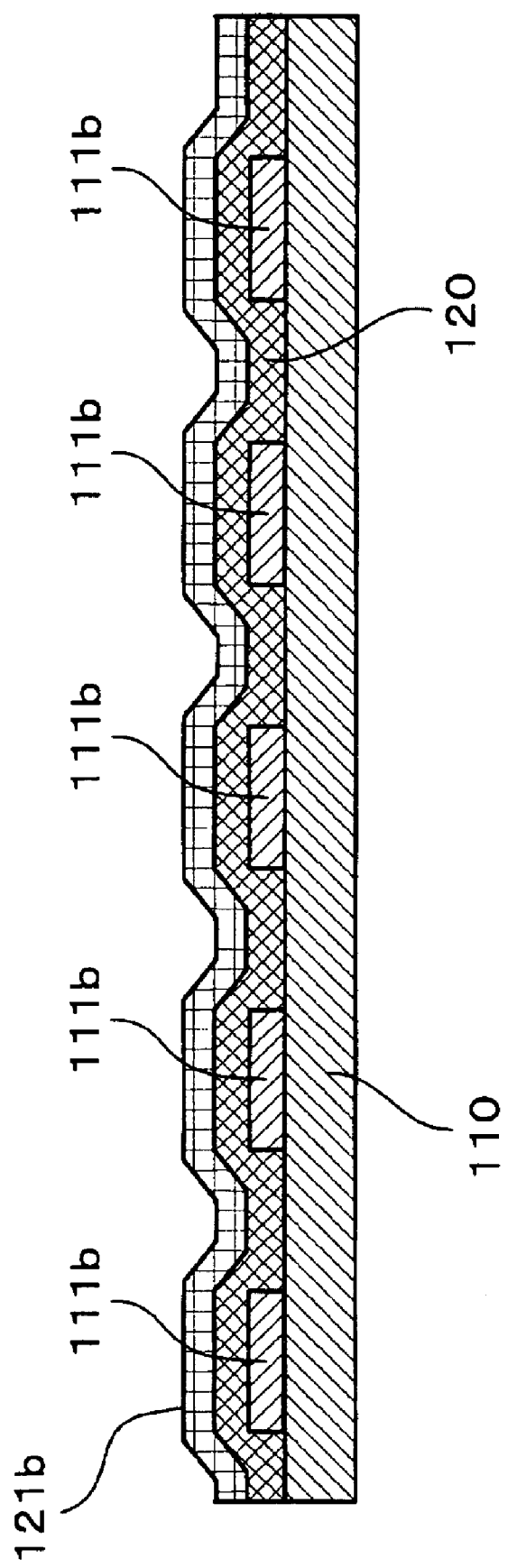
FIG. 9 is a sectional view of the tape substrate, taken along line IX-IX in FIG. 8.

In the tape masking process S204, masking tape formed of, for example, polyimide is applied to mask or cover the areas where the test lands 115 and the IC lands 113 are disposed. FIG. 8 shows the tape substrate 110 with masking tape applied thereto in the tape masking process S204. As shown in FIG. 8, strips of masking tape 121a, 121b mask or cover the areas where the test lands 115 and the IC lands 113 are disposed, respectively. The masking tape 121a is applied so as to cover the entire resist non-application area 120a, that is, to make a side of the masking tape 121a in intimate contact with the solder resist film 120. The masking tape 121b is also applied so as to cover the entire resist non-application area 120c, that is, to make a side of the masking tape 121b in intimate contact with the solder resist film 120. As shown in FIG. 9, formation of the solder resist film 120 makes the surface of the tape substrate 110, which has protruded portions due to the formation of the wiring pattern 111b, flatter. Intimate contact of the masking tape 121b with the solder resist film 120 does not create a gap therebetween. Thus, the resist non-application area 120c is tightly sealed with the masking tape 121b, and the area where the IC lands 113 are provided is reliably masked or covered. The area where the test lands 115 are provided is similarly masked or covered with the masking tape 121a.

Figure 10:
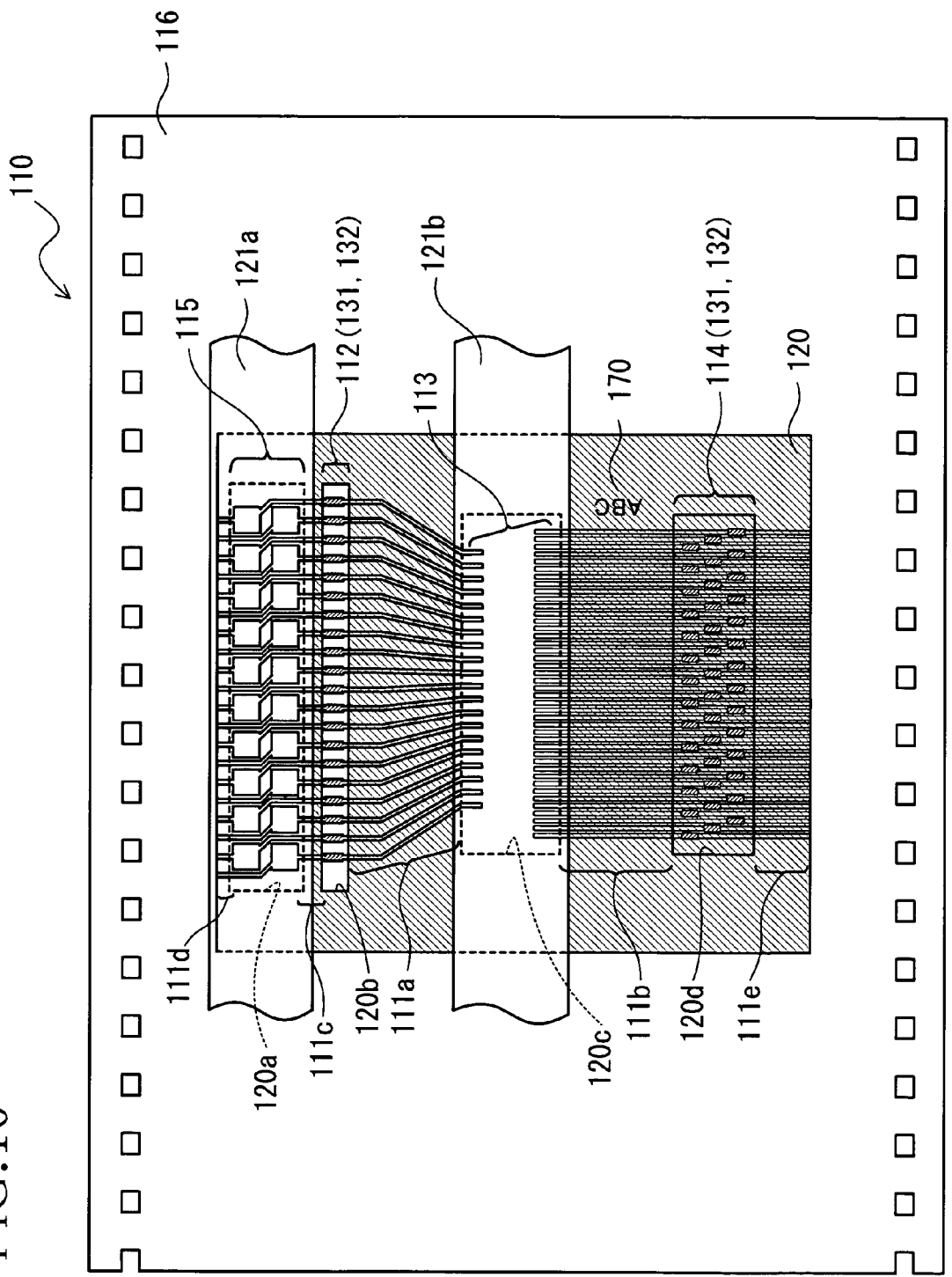
FIG. 10 is a plan view of the tape substrate plated with nickel and solder in nickel and solder plating processes in FIG. 5.

In the nickel plating process S205, the board terminal lands 112 and the actuator lands 114 where the masking tape 121a, 121b is not applied in the tape masking process S204, are plated with nickel, so as to have a thickness of about 35 μm. In the solder plating process S206, the lands 112, 114 plated with nickel in the nickel plating process S205 are further plated with solder, so as to have a thickness of about 10 μm. Nickel plating is performed as a base treatment for solder plating. FIG. 10 shows the tape substrate 110 plated with nickel and solder in the nickel and solder plating processes S205, S206, respectively. The hatch in the board terminal lands 112 and the actuator lands 114 shows that the lands 112, 114 are plated with solder. As shown in FIG. 10, the test lands 115 and the IC lands 113 are masked by the masking tape 121a, 121b, respectively, so that only the board terminal lands 112 and the actuator lands 114 are subjected to the nickel plating 131 and solder plating 132. In the nickel plating process S205 and the solder plating process S206, electrolytic nickel plating and electrolytic solder plating are performed. More specifically, with an electrode of a plating machine for applying voltage being connected to the plating terminal 116, the tape substrate 110 is entirely soaked in an electrolytic nickel bath and an electrolytic solder bath, in the respective processes S205, S206. As voltage is applied to the plating terminal 116, the voltage is applied to the exposed board terminal lands 112 and the actuator lands 114, which are not masked or covered with the masking tape 121a, 121b. Thus, the nickel plating 131 and solder plating 132 are applied.

In the mask removing process S207, the masking tape 121a, 121b, which is applied in the tape masking process S204, is removed after finishing the nickel plating process S205 and the solder plating process S206.

Figure 11:
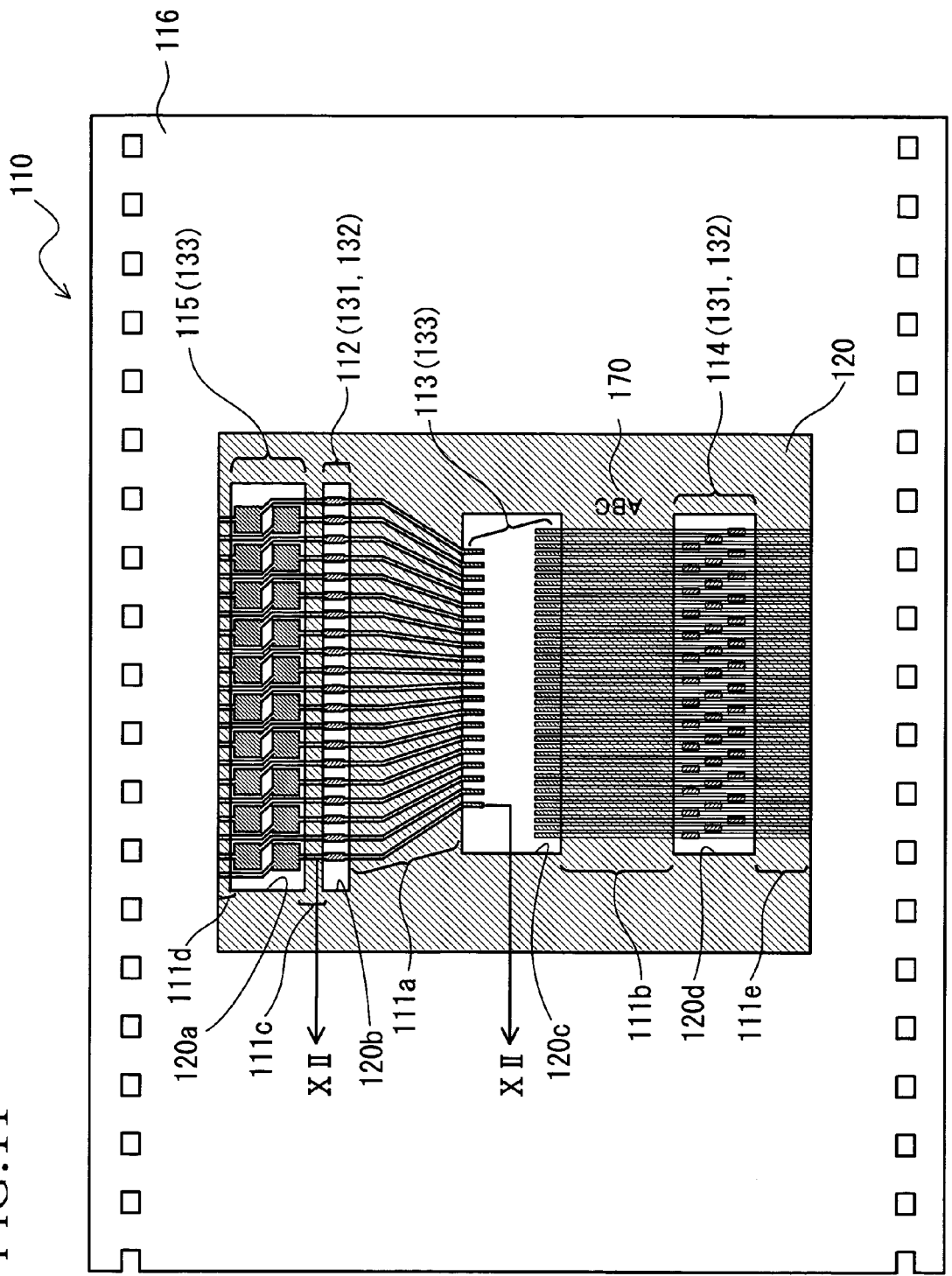
FIG. 11 is a plan view of the tape substrate plated with tin in the tin plating process of FIG. 5.
Figure 12:
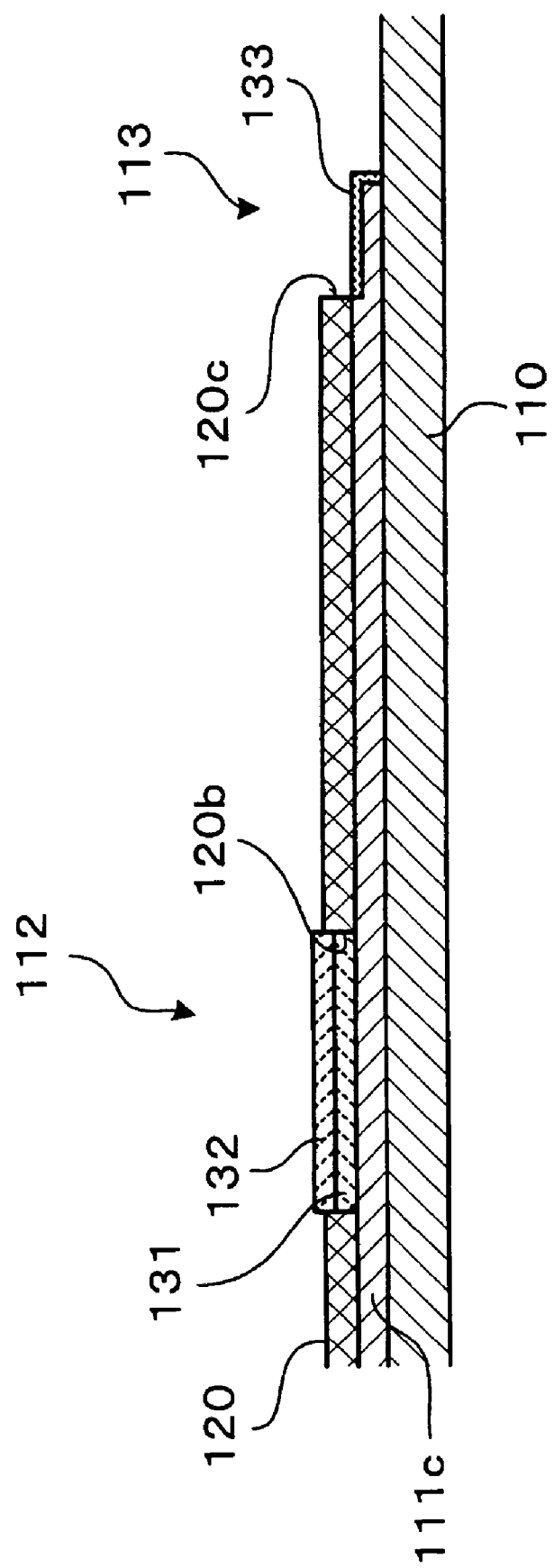
FIG. 12 is a sectional view of the tape substrate, taken along line XII-XII in FIG. 11.

In the tin plating process S208, the IC lands 113 and the test lands 115 are plated with tin, through displacement plating. FIG. 11 shows the tape substrate 110 plated with tin in the tin plating process S208. The hatch in the IC lands 113 and the test lands 115 shows that the lands 113, 115 are plated with tin. As shown in FIG. 12, tin plating performed on the IC lands 113 is displacement plating through which copper surfaces of the lands 113 are replaced with tin. Unlike the nickel plating 131 and solder plating 132 applied to the board terminal lands 112, tin-plated areas are not thickened after tin plating. The areas where the solder plating 132 is applied, are not subjected to tin plating 133, because solder is not replaced with tin through the displacement plating.

Figure 13:
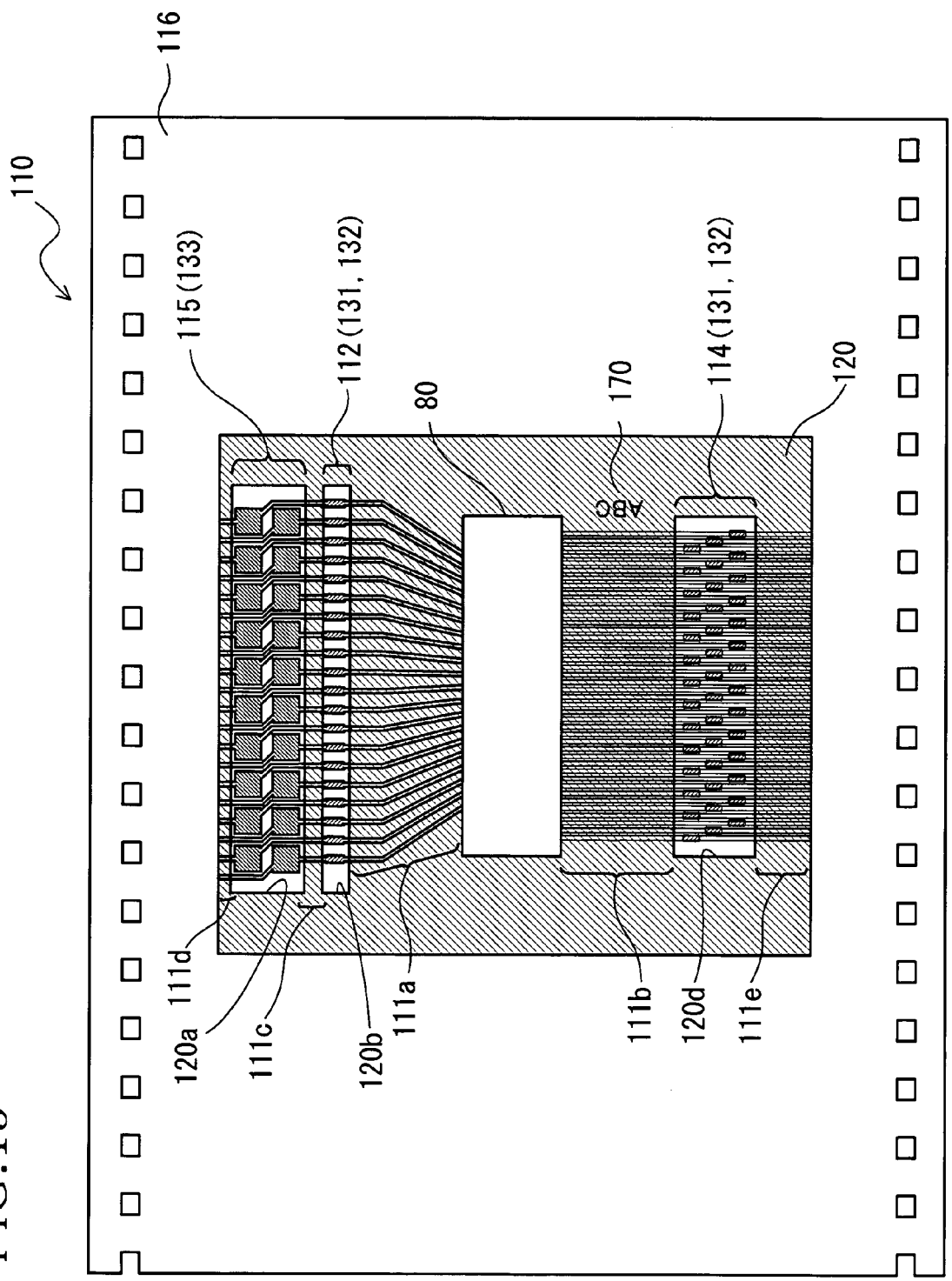
FIG. 13 is a plan view of the tape substrate with the integrated circuit device mounted thereon in an IC mounting process in FIG. 5.

In the IC mounting process S209, the driver IC 80 is mounted on the tape substrate 110 in position relative to the IC lands 113 which are plated with tin in the tin plating process S208. FIG. 13 shows the tape substrate 110 with the driver IC 80 mounted thereon in the IC mounting process S209. In the IC mounting process S209, a predetermined pressure is applied to the driver IC 80 under a condition of a predetermined temperature to press the bumps of the driver IC 80 against the IC lands 113. The tape substrate 110 is heated by a heater at a heater temperature setting of, for example, 100° C. before pressure is applied to the driver IC 80, and then at the heater temperature setting of, for example, 400° C. when pressure is applied to the driver IC 80. Thus, gold of the bumps, on the driver IC 80, and tin, which is plated on the IC lands 113, are alloyed and the bumps and the IC lands 113 are connected or bonded with each other.

Figure 14:
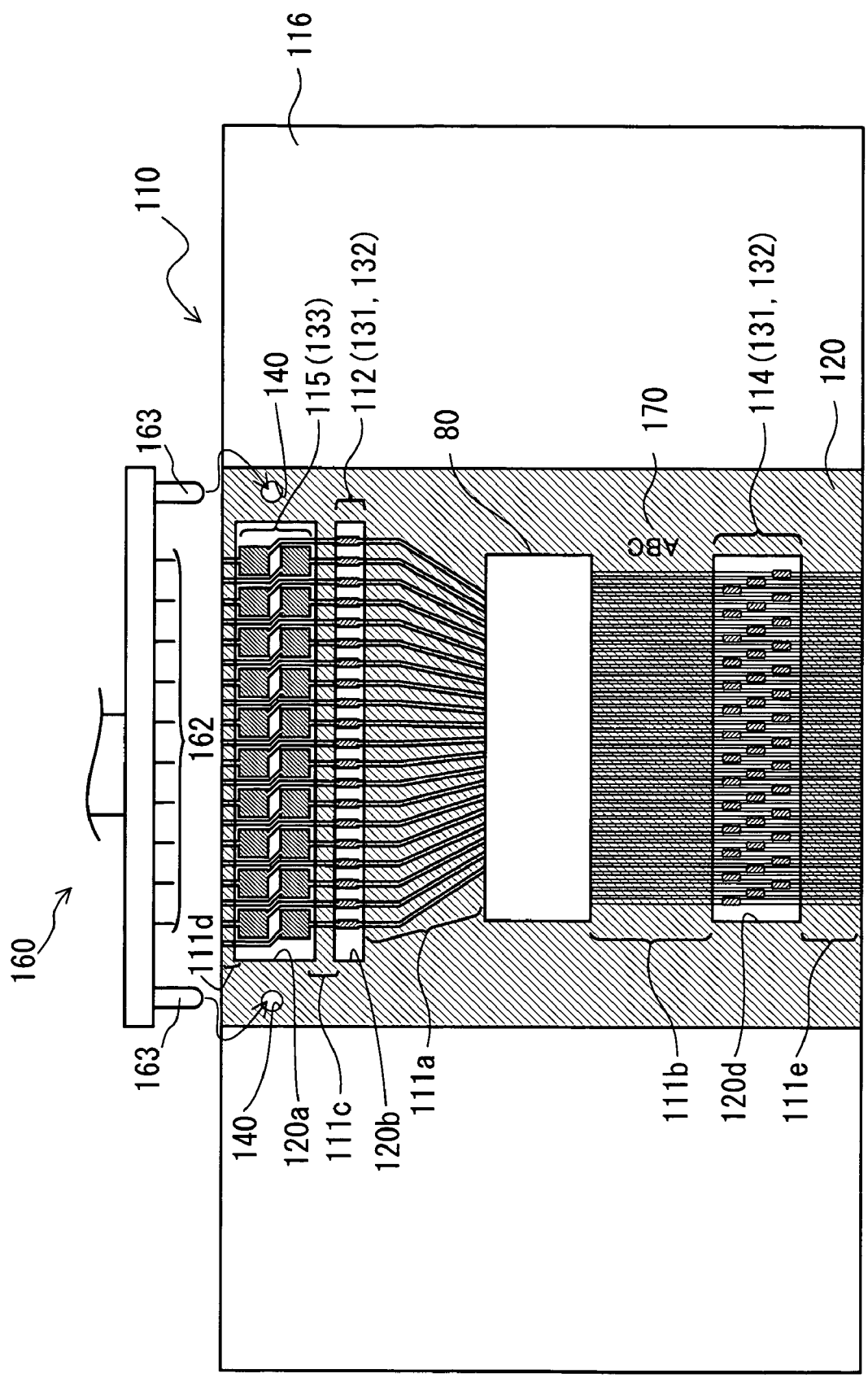
FIG. 14 is a plan view of the tape substrate with a plating terminal insulated in a plating terminal insulating process in FIG. 5.

In the plating terminal insulating process S210, the plating terminal 116 is insulated from the lands 112-115. FIG. 14 shows the tape substrate 110 with the plating terminal 116 insulated in the plating terminal insulating process S210. As shown in FIG. 14, a part of the plating terminal 116 formed at each side of the tape substrate 110 with respect to its width direction is cut off along the longitudinal direction of the tape substrate 110. Thus, the connection between the plating terminal 116 and the wiring pattern 111d, 111e is cut off and the plating terminal 116 and the lands 112-115 are electrically disconnected or insulated. In the plating terminal insulating process S210, formed on the tape substrate 110 at each end of the solder resist film 120 with respect to the longitudinal direction of the tape substrate 110 are positioning holes 140, formed at the same time the sides are cut off, for positioning the probes 162 of the tester 160 relative to the test lands 115, so as to make the positioning probes 162 contact with the test lands 115.

In the testing process S211, the driver IC 80, which is mounted on the tape substrate 110 with the plating terminal 116 electrically disconnected or insulated in the plating terminal insulating process S210, is tested with respect to its operations or functions. As shown in FIG. 14, the tester 160 for testing the driver IC 80 includes the probes 162 and positioning pins 163. In the testing process S211, the positioning pins 163 are inserted into the positioning holes 140 to make the probes 162 contact with the relevant test lands 115. As the probes 162 contact the relevant test lands 115, the tester 160 applies an electrical signal to predetermined bumps of the driver IC 80, to perform an operation check of the driver IC 80. In the operation check of the driver IC 80, failures, such as a malfunction of the driver IC 80 itself, and connection failures, and/or pattern failures, are identified.

Figure 15:
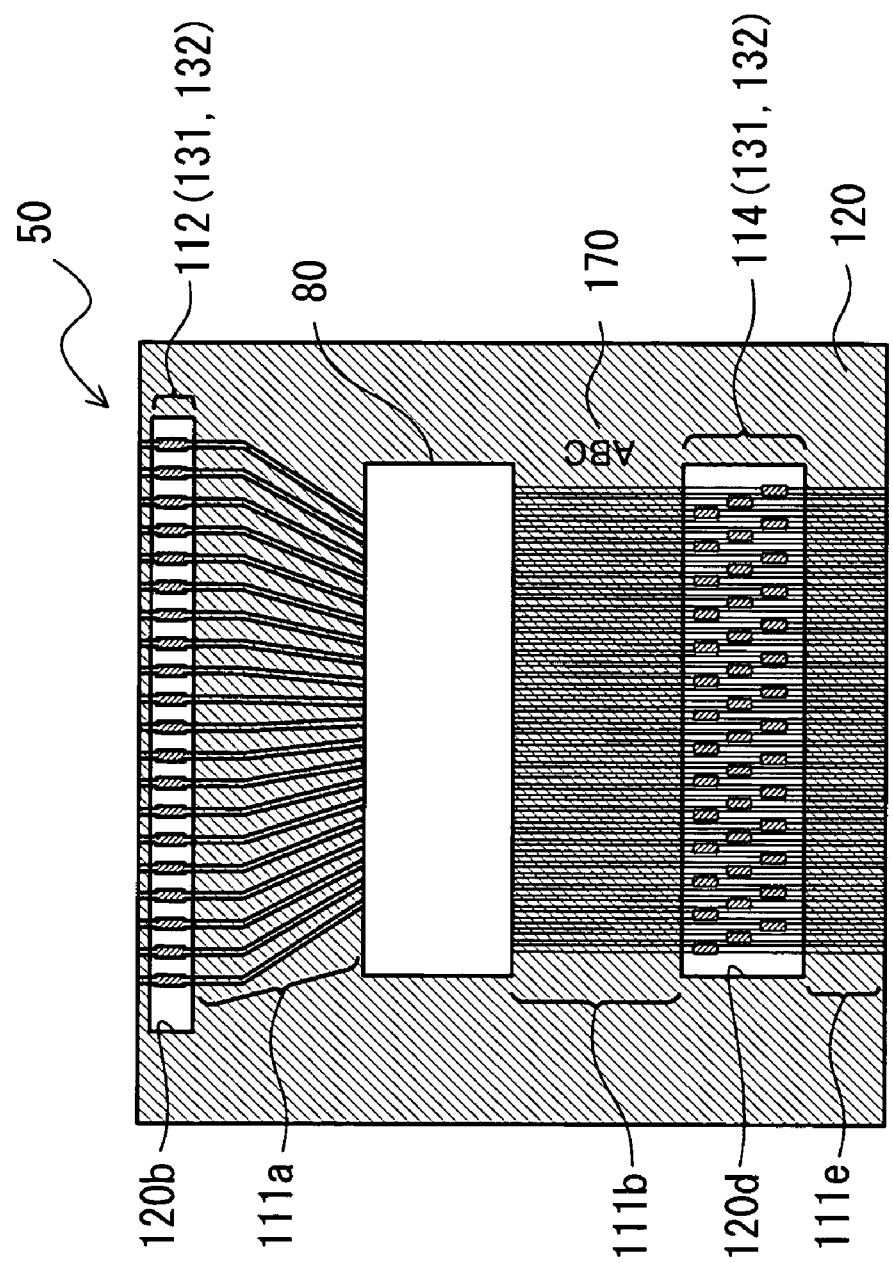
FIG. 15 is a plan view of the printed circuit board with the integrated circuit device mounted thereon, after separation from the tape substrate in a separating process in FIG. 5.

In the separating process S212, a usable portion of the tape substrate 110 mounting thereon the conforming the driver IC 80, which is found to be non-defective in the testing process S211, is separated, i.e., the test lands 115 are removed, to obtain the FPC 50. FIG. 15 shows the FPC 50 with the driver IC 80 mounted thereon after separation from the tape substrate 110. As shown in FIG. 15, in the separating process S212, the area where the test lands 115 are disposed is cut off along the longitudinal direction of the tape substrate 110 and marginal areas are sequentially cut off along the width direction of the tape substrate 110. Thus, the FPC 50 is produced. Through the above-described processes S201-S212, the manufacture of the FPC 50 that mounts the driver IC 80 thereon is completed. In the FPC 50 having the driver IC 80 mounted thereon, the terminals of the board terminal section 81a are soldered onto the board terminal lands 112 and the individual electrodes of the actuator unit 21 are soldered onto the actuator lands 114, as shown in FIG. 4.

In the above-described embodiment, an electrode of a plating machine for applying a voltage is readily connected to the plating terminal 116, so that a voltage application mechanism for plating can be simplified. In addition, the time for positioning the electrode may be reduced. The test lands 115 are disposed outside an area interposed between the board terminal lands 112 and the IC lands 113, so that the test land 115 area is readily separated in the separating process S212. Thus, the manufacturing of the FPC 50 that mounts the driver IC 80 thereon can be effectively performed.

The plating terminal 116 is provided further outside an area where the IC lands 113 and the test lands 115 are disposed, so that the plating terminal 116 can be readily cut off in the plating terminal insulating process S210. Thus, efficient electrical disconnection or insulation between the plating terminal 116 and the IC lands 113 can be achieved. Thus, the FPC 50 that mounts the driver IC 80 thereon can be effectively manufactured.

With the arrangement of the test lands 115 in a matrix, sufficient areas of the test lands 115 are ensured while preventing distance between the adjacent traces of the wiring pattern 111c from being increased. In addition, with the arrangement of the test lands 115 in a matrix, the size of the tape substrate 110, with respect to its longitudinal direction, used as the FPC 50 can be reduced. Thus, the tape substrate 110 can be used efficiently. Further, with such an arrangement of the test lands 115, the distance between the adjacent probes 162, and consequently total length of the probes 162 can be relatively reduced. Thus, positioning of the probes 162 relative to the test lands 115 can be readily performed, so that efficiency in the testing process S211 can be increased.

With the tape masking process S204, an area where the test lands 115 and the IC lands 113 are disposed, is not plated with nickel or solder. Therefore, a short circuit in the test lands 115 or the wiring patterns 111c, 111d at the test land 115 area can be prevented. Further, a short circuit between the IC lands 113 at the IC land 113 area can be prevented.

In the tape masking process S204, the masking tape 121a, 121b is adhered to the tape substrate 110, such that a side of the masking tape 121a, 121b makes intimate contact with the solder resist film 120. Thus, reliable masking with the masking tape 121a, 121b can be achieved.

The test lands 115, the IC lands 113, and the board terminal lands 112 are arranged in the same direction. The wiring pattern 111c directly connects the test lands 115 and the board terminal lands 112. The wiring pattern 111a directly connects the board terminal lands 112 and the IC lands 113. Thus, the wiring pattern arrangements are simplified and the plurality of the test lands 115 is readily separated or cut off at one time.

Further, with the TAB (tape automated bonding) or COP (chip on film) technology, the FPC 50 is made of the tape substrate 110, while carrying the tape substrate 110 through a series of the processes S201-S212. Thus, the manufacture of the FPCs 50 can be effectively performed.

The identifier 170 for identifying the FPC 50 is provided beside the wiring pattern 111b near a central portion of the FPC 50, and is not separated or cut off in the plating terminal insulating process S210 or the separating process S212.

Although the invention has been described with reference to an exemplary embodiment, it is to be understood that the invention is not restricted to the particular forms shown in the foregoing embodiment. Various modifications and alterations can be made thereto without departing from the scope of the invention, as set forth in the appended claims.

For example, although the test lands 115 are arranged in a matrix on the FPC 50 in the above-described embodiment, the test lands 115 may be arranged straightly.

In the embodiment, one plating terminal 116 is provided so as to surround all of the lands 112-115. However, different structures may be employed. For example, a plurality of plating terminals 116 may be provided, or a plating terminal 116 may be partly provided on the surrounding of the lands 112-115, so as to electrically connect to the lands 112-115.

In the embodiment, areas where the test lands 115 and the IC lands 113 are disposed, are masked or covered with the masking tape 121a, 121b in the tape masking process S204 during the manufacture of the FPC 50 that mounts the driver IC 80 thereon. However, if there is no possibility of short circuits, masking of at least one area where the IC lands 113 or the test lands 115 are disposed, may be omitted. Unless the adjacent test lands 115, the adjacent IC lands 113, or the adjacent wiring patterns 111a-111e connected to the lands 113, 115 are closely disposed, the IC land 113 area and the test land 115 area may be plated with nickel and solder, without performing the tape masking process S204 and the tin plating process S208.

Further, in the embodiment, the solder resist film 120 is formed in the resist film forming process S202, during the manufacture of the FPC 50 that mounts the driver IC 80 thereon. However, without forming the solder resist film 120 in the resist film forming process S202, the masking areas may be covered with the masking tape.

In the above-described exemplary embodiment, the metal patterns are formed by etching in the pattern forming process in S201. However, the metal patterns may be formed by ejecting metal powders onto a circuit board using printing technology, or using other methods.

Further, the embodiment according to the invention is applied to the FPC 50 for use with the print head 1. However, the invention may be applied to FPCs or printed circuit boards for use in electronic apparatuses other than inkjet printers.

What is claimed is:

1. A method for manufacturing a printed circuit board that mounts an integrated circuit device thereon, comprising:
   a pattern forming step of forming on the printed circuit board, a plurality of device lands for being electrically connected to pins of the integrated circuit device, a plurality of terminal lands for being electrically connected to terminals of an external device, a plurality of test lands used for performing an operational test of the integrated circuit device when the integrated circuit device is mounted on the printed circuit board, a plating terminal used for plating the terminal lands, and a wiring pattern including a plurality of traces that electrically connect the device lands to the terminal lands, the test lands and the plating terminal, such that all the test lands are disposed outside an area interposed between the plurality of terminal lands and the plurality of device lands;
   a terminal land plating step of applying electrolytic plating to the terminal lands using the plating terminal;
   a mounting step of mounting the integrated circuit device on the printed circuit board so as to electrically connect the device lands and the pins;
   a plating terminal insulating step of electrically disconnecting the terminal lands and the plating terminal after the terminal land plating step;
   a testing step of performing an operational test of the integrated circuit device mounted in the mounting step; and
   a separating step of separating a portion of the printed circuit board where the plurality of device lands and the plurality of terminal lands are disposed, from a portion of the printed circuit board where the plurality of test lands are disposed.

2. The method according to claim 1, wherein in the pattern forming step, the plating terminal is formed at both end portions of an area including the plurality of device lands, the plurality of terminal lands, and the plurality of test lands.

3. The method according to claim 2, wherein in the pattern forming step, the plating terminal is formed to surround the plurality of device lands, the plurality of terminal lands and the plurality of test lands.

4. The method according to claim 1, wherein in the pattern forming step, the plurality of test lands are arranged in a matrix and the wiring pattern is formed such that each of the traces thereof passes between the adjacent test lands.

5. The method according to claim 4, further comprising a tape masking step of attaching masking tape, before the terminal land plating step, to an area including the plurality of the test lands, to prevent electrolytic plating from being applied to the test lands.

6. The method according to claim 5, wherein in the tape masking step, the masking tape is attached to an area including the plurality of device lands.

7. The method according to claim 6, further comprising a resist film forming step of forming a solder resist film around the area including the plurality of device lands and the area including the plurality of test lands, wherein the masking tape is attached on the solder resist film in the tape masking step.

8. The method according to claim 7, further comprising:
   a mask removing step of removing the masking tape from the area including the plurality of device lands and the area including the plurality of test lands; and a displacement plating step of applying displacement plating to the plurality of device lands.

9. The method according to claim 8, wherein the terminal land plating step includes a nickel plating step of plating the terminal lands with nickel and a solder plating step of plating the terminal lands with solder after the nickel plating step.

10. The method according to claim 9, wherein in the displacement plating step, surfaces of the device lands are replaced with tin.

11. The method according to claim 1, wherein in the pattern forming step, a metal layer of copper is formed on a polyimide film substrate and the metal layer is etched to form the plurality of the device lands, the plurality of terminal lands, the plurality of test lands, the plating terminal and the wiring pattern.

* * * * *